US009349741B2

(12) United States Patent
Liu

(10) Patent No.: US 9,349,741 B2
(45) Date of Patent: May 24, 2016

(54) RECESSED SALICIDE STRUCTURE TO INTEGRATE A FLASH MEMORY DEVICE WITH A HIGH κ, METAL GATE LOGIC DEVICE

(71) Applicant: Taiwan Semiconductor Manufacturing Co., Ltd., Hsin-Chu (TW)

(72) Inventor: Ming Chyi Liu, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 14/330,140

(22) Filed: Jul. 14, 2014

(65) Prior Publication Data

US 2016/0013198 A1    Jan. 14, 2016

(51) Int. Cl.
*H01L 27/115* (2006.01)
*H01L 21/28* (2006.01)

(52) U.S. Cl.
CPC .... *H01L 27/11524* (2013.01); *H01L 21/28008* (2013.01); *H01L 21/28273* (2013.01)

(58) Field of Classification Search
CPC ...................... H01L 27/1157; H01L 27/11524; H01L 27/11563; H01L 27/11521; H01L 21/02425; H01L 21/28008; H01L 21/28273; H01L 2924/1431; H01L 2924/1438
See application file for complete search history.

(56) References Cited

U.S. PATENT DOCUMENTS

2014/0001529 A1* 1/2014 Hsieh ................ H01L 29/66825
257/314

* cited by examiner

*Primary Examiner* — Armando Rodriguez
(74) *Attorney, Agent, or Firm* — Eschweiler & Associates, LLC

(57) ABSTRACT

An integrated circuit for an embedded flash memory device is provided. A semiconductor substrate includes a memory region and a logic region adjacent to the memory region. A logic device is arranged over the logic region and includes a metal gate separated from the semiconductor substrate by a material having a dielectric constant exceeding 3.9. A flash memory cell device is arranged over the memory region. The flash memory cell device includes a memory cell gate electrically insulated on opposing sides by corresponding dielectric regions. A silicide contact pad is arranged over a top surface of the memory cell gate. The top surface of the memory cell gate and a top surface of the silicide contact pad are recessed relative to a top surface of the metal gate and top surfaces of the dielectric regions. A method of manufacturing the integrated circuit is also provided.

20 Claims, 16 Drawing Sheets

US 9,349,741 B2

RECESSED SALICIDE STRUCTURE TO INTEGRATE A FLASH MEMORY DEVICE WITH A HIGH κ, METAL GATE LOGIC DEVICE

BACKGROUND

The semiconductor manufacturing industry has experienced exponential growth over the last few decades. In the course of semiconductor evolution, functional density (i.e., the number of interconnected devices per chip area) has generally increased while geometry size (i.e., the smallest component or line that can be created using a fabrication process) has generally decreased. One advancement has been the development of semiconductor devices, such as transistors, employing metal gates insulated by materials having a high dielectric constant (κ). Such semiconductor devices have improved performance with decreased feature sizes, relative to traditional polysilicon gates insulated by silicon dioxide.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
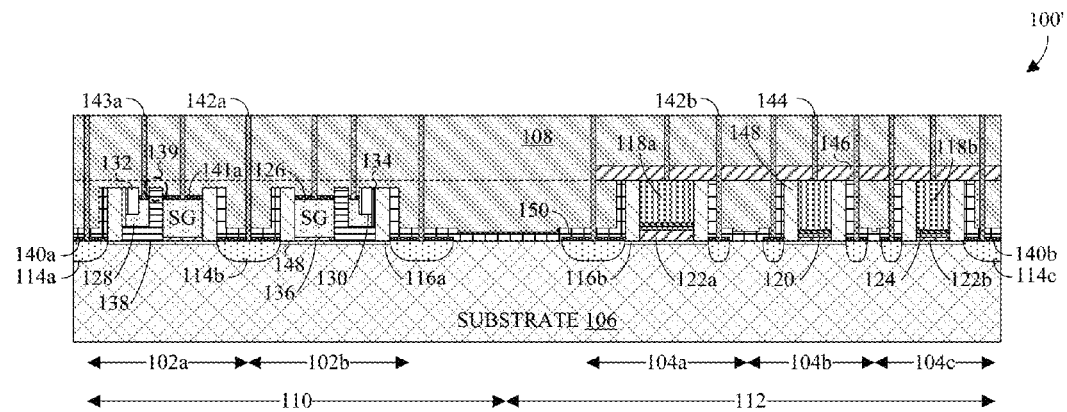
FIG. 1A illustrates a cross-sectional view of some embodiments of a semiconductor structure with memory cell devices and high κ, metal gate logic devices, the memory cell devices including recessed gates upon which silicide is formed.

The present disclosure provides many different embodiments, or examples, for implementing different features of this disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A trend in the semiconductor manufacturing industry is to integrate different semiconductor components of a composite semiconductor device into a common semiconductor structure. Such integration advantageously allows lower manufacturing costs, simplified manufacturing procedures, and increased operational speed. One type of composite semiconductor device often integrated into a common semiconductor structure is a flash memory device. A flash memory device includes an array of flash memory cell devices and logic devices supporting operation of the flash memory cell devices. When the array of flash memory cell devices and the logic devices are integrated into a common semiconductor structure, the flash memory device is often referred to as an embedded flash memory device.

Common types of flash memory cell devices include stacked gate flash memory cell devices and split gate flash memory cell devices. Split gate flash memory cell devices have several advantages over stacked gate flash memory cell devices, such as lower power consumption, higher injection efficiency, less susceptibility to short channel effects, and over erase immunity. Examples of split gate flash memory cell devices include silicon-oxide-nitride-oxide-silicon (SONOS) split gate flash memory cell devices, metal-oxide-nitride-oxide-silicon (MONOS) split gate flash memory cell devices, and third generation SUPERFLASH (ESF3) memory cell devices.

Embedded flash memory devices include flash memory cell devices, which are typically formed with polysilicon gates insulated by silicon dioxide, as well as logic devices, such as, for example, address decoders or read/write circuitry. However, as semiconductor feature sizes get smaller and smaller, the logic devices of such embedded flash memory devices are reaching performance limits. High κ metal gate (HKMG) technology has become one of the front runners for the logic devices in the next generation of embedded flash memory devices. HKMG technology employs a metal gate separated from the underlying substrate by a material with a high dielectric constant κ (relative to silicon dioxide). The high κ dielectric reduces leakage current and increases the maximum drain current, and the metal gate mitigates the effects of fermi-level pinning and allows the gate to be employed at lower threshold voltages. Further, the high κ dielectric and the metal gate collectively reduce power consumption.

In forming an embedded flash memory device employing HKMG technology according to some methods, the flash memory cell devices are formed with polysilicon gates. Subsequently, the logic devices are formed with sacrificial gates insulated by a high κ dielectric. With the flash memory cell devices and the logic devices formed, silicide is formed over the source/drain regions of the memory cell devices and logic devices. The silicide advantageously reduces the resistance between the source/drain regions and subsequently formed contacts. Further, an interlayer dielectric covering the logic devices is formed and a first planarization is performed into the interlayer dielectric to the polysilicon gates. Subsequent to the first planarization, the sacrificial gates of the logic devices are replaced with metal gates, while leaving polysilicon gates of the flash memory cell devices. This includes removing the sacrificial gates to form recesses, filling the recesses with a metal layer, and performing a second planarization into the metal layer to form metal gates co-planar with the polysilicon gates. Ideally, the silicide would be formed over the polysilicon gates concurrent with the source/drain regions to reduce contact resistance. However, metal contamination may occur during the first planarization. Further, regardless of the metal contamination, the second planarization removes the silicide over the polysilicon gates during a 28 nanometer (nm) manufacture. Hence, during a 28 nm manufacture, HKMG technology is incompatible with forming silicide over the polysilicon gates before the second planarization according to the foregoing methods.

According to other methods to manufacturing embedded flash devices, silicide is formed over gates of the polysilicon gates of the flash memory cell devices after the second planarization. However, this method introduces bridge concerns between neighboring gates of the memory cell devices. For example, SONOS split gate flash memory cell devices include neighboring select and memory gates separated by a thin charge trapping dielectric. The silicide can form over the charge trapping dielectric and bridge the select and memory gates. Because the silicide is electrically conducting, this bridge, if present, can short the select and memory gates together resulting in a non-functional memory cell.

In view of the foregoing, the present disclosure is directed to an improved method of integrating a flash memory device with a high κ, metal gate logic device, as well as the resulting semiconductor structure. The improved method recesses gates of the flash memory cell devices subsequent to the metal gate planarization, and leaves a thin, dielectric projection extending upward from between the recessed gate regions. Silicide is then formed over top surfaces of the recessed gates, while the logic devices are masked. The resulting semiconductor structure includes silicide formed lower than top surfaces of neighboring dielectrics and metal gates of the logic devices. Because the dielectric projection is arranged between the recessed gate regions and has a height that is greater than that of the formed silicide, the dielectric projection prevents or limits bridging concerns between the recessed gate regions. Thus, the improved method and semiconductor structure advantageously prevent silicide bridging between neighboring gates of the flash memory cell devices by increasing (with the recessing) the distance between the top surfaces. Further, the improved method and semiconductor structure advantageously prevent metal contamination during the first planarization and reduce resistivity between the gates of the flash memory cell devices and subsequently formed contacts.

With reference to FIG. 1A, a cross-sectional view 100' of some embodiments of a semiconductor structure (e.g., representing an integrated circuit) with memory cell devices 102a, 102b and high κ, metal gate logic devices 104a-c is provided. The memory cell devices 102 include a first memory cell device 102a and a second memory cell device 102b. The memory cell devices 102 store data in a nonvolatile manner and are, for example, MONOS or SONOS split gate flash memory cell devices. The logic devices 104 include a first logic device 104a, a second logic device 104b, and a third logic device 104c. The logic devices 104 coordinate to implement logic supporting operation of the memory cell devices 102 and are, for example, transistors.

The memory cell devices 102 and the logic devices 104 are formed over and/or within a semiconductor substrate 106 and covered by an interlayer dielectric 108. The memory cell devices 102 are localized to a memory region 110 of the semiconductor substrate 106, and the logic devices 104 are localized to a logic region 112 of the semiconductor substrate 106 that is typically arranged around the periphery of the memory region 110. The semiconductor substrate 106 is, for example, a bulk substrate of silicon, germanium, or group III and group V elements. Alternatively, the semiconductor substrate 106 is, for example, a semiconductor-on-insulator (SOI) substrate. The interlayer dielectric 108 is, for example, an oxide, such as silicon dioxide, or a low-K dielectric material.

Embedded within the top surface of the semiconductor substrate 106, the semiconductor substrate 106 includes source/drain regions 114a-c. The source/drain regions 114 are spaced to form channel regions 116a, 116b therebetween that are individual to the memory cell devices 102 and the logic devices 104. In some embodiments, the source/drain regions 114 include source/drain regions 114b shared by multiple channel regions 116a. For example, the memory cell devices 102 are typically formed in pairs with source/drain regions 114a individual to the memory cell devices 102, and source/drain regions 114b shared by the memory cell devices 102 of the pairs.

Over each channel region 116 in the logic region 112, a logic device 104 includes a metal gate 118a, 118b electrically isolated from the channel region 116 by a high κ dielectric 120. A high κ dielectric 120 is a dielectric with a dielectric constant κ greater than the dielectric constant of silicon dioxide (i.e., 3.9). In some embodiments, the top surface of the metal gate 118 is about 350-700 Angstroms (A) from the top surface of the semiconductor substrate 106. A metal gate dielectric 122a, 122b is arranged between the semiconductor substrate 106 and the high κ dielectric 120. For high voltage applications, the metal gate dielectric 122 is typically thicker than it would otherwise be. Thus, logic device 104a can be a high-voltage transistor with a thick metal gate dielectric 122a, while logic devices 104b and 104c can be low-voltage transistors with thinner metal gate dielectrics 122b. Further, an etch stop 124 is arranged between the metal gate 118 and the high κ dielectric 120. The metal gate 118 is, for example, tantalum, tantalum nitride, or niobium, the metal gate dielectric 122 is, for example, an oxide, such as silicon dioxide, the etch stop 124 is, for example, silicon nitride, and the high κ dielectric 120 is, for example, hafnium oxide ($HfO_2$), aluminum oxide ($AlO_3$), or tantalum pentoxide ($Ta_2O_5$).

Over each channel region 116 in the memory region 110, a memory cell device 102 includes a select gate 126 and a memory gate 128 spaced between the source/drain regions 114 of the channel region 116. In some embodiments, the select gate 126 is arranged proximate to a source/drain region 114b shared with other memory cell devices 102, and the memory gate 128 is arranged proximate to a source/drain region 114a individual to the memory cell device 102. The top surfaces of both the select gate 126 and the memory gate 128 are recessed relative to top surfaces of the metal gates 118 by, for example, about 10-500 A or 150-400 A and, in some embodiments, substantially planar. Further, whereas the gates 118 of the logic devices 104 are metal, the gates 126, 128 of the memory cell devices 102 are typically polysilicon. The select gate 126 has, for example, a generally rectangular profile, and the memory gate 128 has, for example, a generally asymmetrical, stepped profile. The generally asymmetrical, stepped profile includes a memory gate ledge 130 exhibiting a reduced height relative to a top surface of the memory gate 128 and running along a memory gate edge facing away from the select gate 126. In some embodiments, the memory gate 128 has a height of about 100 A between the memory gate ledge 130 and the bottom surface of the memory gate 128.

A memory gate spacer 132 extends vertically up from the memory gate ledge 130, along an upper, inner sidewall of the memory gate 128. The memory gate spacer 132 extends vertically up to above (e.g., 100-300 A above) the top surfaces of the memory and select gate 126, 128 and, in some embodiments, below (e.g., 50-100 A below) top surfaces of the metal gates 118. A thin spacer 134 is arranged to cover a lower, outer sidewall of the memory gate 128 adjacent to the memory gate spacer 132. In some embodiments, the thin spacer 134 extends vertically up from approximately even with a bottom surface of the memory gate 128, along sidewalls of the memory gate 128 and the memory gate spacer 132, to approximately coplanar with the top surfaces of the memory gate spacer 132.

Arranged between the semiconductor substrate 106 and the select gate 126, a select gate dielectric 136 electrically isolates the select gate 126 from the semiconductor substrate 106. Further, arranged between the semiconductor substrate 106 and the memory gate 128, a charge trapping dielectric 138 electrically isolates the memory gate 128 from the semiconductor substrate 106. The charge trapping dielectric 138 further extends vertically up to fill the space between the memory gate 128 and the select gate 126 and to electrically isolate the memory gate 128 from the select gate 126. The charge trapping dielectric 138 extends vertically up to above (e.g., 100-300 A above) the top surfaces of the memory and select gates 126, 128 and, in some embodiments, below (e.g., 50-100 A below) top surfaces of the metal gates 118. By extending above the top surfaces of the memory and select gates 126, 128, the charge trapping dielectric 138 forms a dielectric projection 139 separating the top surfaces of the memory and select gates 126, 128. Further, in some embodiments, the charge trapping dielectric 138 has a thickness of about 100-200 A. The select gate dielectric 136 is, for example, an oxide, such as silicon dioxide, and the charge trapping dielectric 138 is, for example, a multilayer dielectric, such as an oxide-nitride-oxide (ONO) dielectric or an oxide-silicon dot-oxide (OSiO) dielectric. In some embodiments, where the charge trapping dielectric 138 is an OSiO or ONO dielectric, the oxide layer adjacent the sidewall of the select gate 126 is about 30 A thick, and the other oxide layer is about 80 A.

A source/drain silicide contact pad 140a, 140b is formed over each source/drain region 114, and a memory silicide contact pad 141a is formed over each select and memory gate 126, 128 of the memory cell devices 102. In some embodiments, the contact pads 140, 141 have a height of about 50-200 A. Source/drain conductive contacts 142a, 142b individual to the source/drain regions 114, and memory conductive contacts 143a individual to the select and memory gates 126, 128 of the memory cell devices 102, extend vertically down through the interlayer dielectric 108 to corresponding silicide contact pads 140, 141. The silicide contact pads 140, 141 reduce resistance between the conductive contacts 142, 143, the source/drain regions 114 and the select and memory gates 126, 128 of the memory cell devices 102 by providing a better, lower resistance contact surface for the conductive contacts 142, 143. The silicide contact pads 140, 141 are, for example, nickel silicide, cobalt silicide, or titanium silicide and, in some embodiments, have substantially planar top surfaces. Logic conductive contacts 144 individual to the metal gates 118 of the logic devices 104 also extend vertically down through the interlayer dielectric 108 and a dielectric mask 146 to the metal gates 118. The dielectric mask 146 is typically formed of oxide and masks or covers the logic devices 104. In some embodiments, the dielectric mask 146 has a thickness of about 50-300 A. The conductive contacts 142, 143, 144 are, for example, formed of one or more of titanium, titanium nitride, and tungsten.

A main sidewall structure 148 is arranged on sidewalls of the memory cell devices 102 and the logic devices 104. The main sidewall structure 148 extends vertically up from the semiconductor substrate 106 to above (e.g., 100-300 A above) the top surfaces of the memory and select gates 126, 128 and, in some embodiments, below (e.g., 50-100 A below) top surfaces of the metal gates 118. For example, for a memory cell device 102, the main sidewall structure 148 extends on a first side of the memory cell device 102 from the semiconductor substrate 106, along sidewalls of the charge trapping dielectric 138 and the thin spacer 134. On the opposing side of the memory cell device 102, the main sidewall structure 148 extends from the semiconductor substrate 106, along sidewalls of the select gate dielectric 136 and the select gate 126. As another example, for a logic device 104, the main sidewall structure 148 extends from the semiconductor substrate 106, along opposing sidewalls of the metal gate dielectric 122, the high κ dielectric 120, the etch stop 124, and the metal gate 118. The main sidewall structure 148 is, for example, a dielectric, such as silicon nitride.

A contact etch stop 150 is arranged over the base of the semiconductor substrate 106 above the silicide contact pads 140, 141 and along sidewalls of the main sidewall structure 148. Top surfaces of the contact etch stop 150 extend to above (e.g., 100-300 A above) the top surfaces of the memory and select gate 126, 128 and, in some embodiments, below (e.g., 50-100 A below) top surfaces of the metal gates 118.

By way of recessing the top surfaces of the select and memory gates 126, 128 of the memory cell devices 102 relative to the top surfaces of the metal gates 118, the memory silicide contact pads 141 formed over the top surfaces of the select and memory gates 126, 128 are also recessed relative to the top surfaces of the metal gates 118. Further, by forming one or more of the charge trapping dielectrics 138, the thin and memory gate spacers 132, 134, the main sidewall structure 148, and the contact etch stop 150 to extend to above (e.g., 100-300 A above) the top surfaces of the memory and select gate 126, 128, the memory silicide contact pads 141 are also recessed relative to these structures. Advantageously, recessing the memory silicide contact pads 141 while leaving a dielectric projection 139 therebetween mitigates the possibility of forming a silicide bridge between the memory and select gates 126, 128, since the top surfaces of the memory and select gates 126, 128 are spaced farther apart. Further, recessing the memory silicide contact pads 141 allows compatibility with HKMG technology.

In operation, each memory cell device 102 stores a variable amount of charge, such as electrons, in the charge trapping dielectric 138. The charge is advantageously stored in a non-volatile manner so that the stored charge persists in the absence of power. The amount of charge stored in the charge trapping dielectric 138 represents a value, such as binary value, and is varied through program (i.e., write), read, and erase operations. These operations are performed through selective biasing of the select gate 126 and the memory gate 128.

During a program or erase operation of a memory cell device 102, the memory gate 128 is forward or reversed biased with a high (e.g., at least an order of magnitude higher) voltage relative a voltage applied across the channel region 116 and/or relative to a voltage applied to the select gate 126. In some embodiments, forward biasing is used for a program operation, and reverse biasing is used for an erase operation. During a program operation, the high bias voltage promotes Fowler-Nordheim tunneling of carriers from the channel region 116 towards the memory gate 128. As the carriers tunnel towards the memory gate 128, the carriers become trapped in the charge trapping dielectric 138. During an erase operation, the high bias voltage promotes Fowler-Nordheim tunneling of carriers in the charge trapping dielectric 138 away from the memory gate 128. As the carriers tunnel away from the memory gate 128, the carriers become dislodged or otherwise removed from the charge trapping dielectric 138.

Charge stored in the charge trapping dielectric 138 of a memory cell device 102 screens an electric field formed between the memory gate 128 and the channel region 116 when the memory gate 128 is biased. This has an effect of increasing the threshold voltage $V_{th}$ of the memory cell device 102 by an amount $\Delta V_{th}$. During a read operation, a voltage is applied to the select gate 126 to induce part of the channel region 116 to conduct. Application of a voltage to the select gate 126 attracts carriers to part of the channel region 116 adjacent to the select gate 126. Further, a voltage greater than $V_{th}$, but less than $V_{th}+\Delta V_{th}$, is applied to the memory gate 128. If the memory cell device 102 turns on (i.e., allows charge to flow), then it stores a first data state (e.g., a logical "0"). If the memory cell device 102 does not turn on, then it stores a second data state (e.g., a logical "1").

Figure 1B:
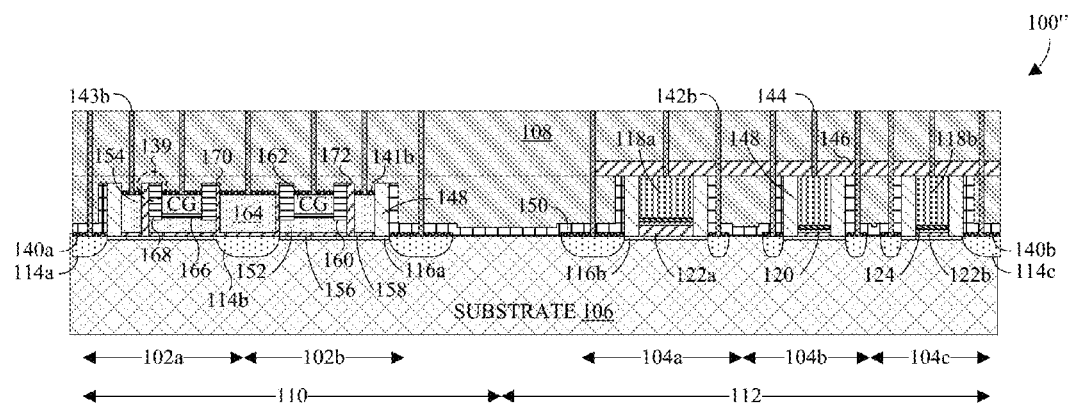
FIG. 1B illustrates a cross-sectional view of some embodiments of a semiconductor structure with memory cell devices and high κ, metal gate logic devices, the memory cell devices including recessed gates upon which silicide is formed.

With reference to FIG. 1B, a cross-sectional view 100" of some embodiments of a semiconductor structure (e.g., representing an integrated circuit) with memory cell devices 102a, 102b and high κ, metal gate logic devices 104a-c is provided. In contrast with the embodiments of FIG. 1A, the memory cell devices 102 have a different structure. The memory cell devices 102 store data in a nonvolatile manner and are, for example, ESF3 split gate flash memory cell devices. The logic devices 104 coordinate to implement logic supporting operation of the memory cell devices 102 and are, for example, transistors.

Over each channel region 116 in the memory region 110, a memory cell device 102 includes a floating gate 152 and a word line 154 spaced between the source/drain regions 114 of the channel region 116. Arranged between the semiconductor substrate 106 and the floating gate 152, a floating gate dielectric 156 provides electrical isolation between the semiconductor substrate 106 and the floating gate 152. Further, arranged between the word line 154 and the semiconductor substrate 106, a word line dielectric 158 provides electrical isolation between the semiconductor substrate 106 and the word line 154. In some embodiments, the floating gate 152 is recessed on opposing sides proximate to the source/drain regions of the channel region 116 to define a pair of floating gate ledges 160. The floating gate ledges 160 exhibit a reduced height relative to a top surface of the floating gate 152 and run along opposing floating gate edges facing the source/drain regions 114 of the channel region 116. In this way, the floating gate 152 has a symmetrical, stepped appearance when viewed in profile. The top surface of the word line 154 is recessed relative to top surfaces of the metal gates 118 by about 10-500 Å or 150-400 Å. The floating gate 152 and the word line 154 are, for example, polysilicon. The floating gate and the word line dielectrics 156, 158 are, for example, oxides, such as silicon dioxide.

The memory cell device 102 further includes a control gate 162 and an erase gate 164. The erase gate 164 is arranged over a source/drain region 114 of the channel region 116 that is shared with a neighboring memory cell device 102 and on an opposite side of the floating gate 152 as the word line 154. The top surface of the erase gate 164 is recessed relative to top surfaces of the metal gates 118 by, for example, about 10-500 Å or 150-400 Å and, in some embodiments, substantially planar. The control gate 162 is arranged over the top surface of the floating gate 152 with an inter-gate dielectric 166 arranged between the control gate 162 and the floating gate 152. The inter-gate dielectric 166 electrically isolates the floating gate 152 from the control gate 162. The top surface of the control gate 162 is recessed relative to top surfaces of the metal gates 118 by, for example, about 10-500 Å or 150-400 Å and, in some embodiments, substantially planar. The control gate 162 and the erase gate 164 are, for example, polysilicon. The inter-gate dielectric 166 is, for example, an ONO dielectric.

Arranged between the control gate 162 and both the erase gate 164 and the word line 154, a floating gate spacer 168 provides electrical isolation. The floating gate spacer 168 extends vertically up from the floating gate ledges 160, along sidewalls of the control gate 162, to above (e.g., 100-300 Å above) the top surfaces of the word line 154 and the erase gate 164 and, in some embodiments, below (e.g., 50-100 Å below) top surfaces of the metal gates 118. Lining a central region between neighboring memory cell devices 102, a dielectric liner 170 insulates the erase gate 164 from the semiconductor substrate 106, the floating gate 152, and the control gate 162. The dielectric liner 170 extends vertically up to above (e.g., 100-300 Å above) the top surfaces of the word line 154 and the erase gate 164 and, in some embodiments, below (e.g., 50-100 Å below) top surfaces of the metal gates 118. Arranged between the word line 154 and the floating gate 152, a thin sidewall structure 172 electrically isolates the word line 154 from the floating gate 152. The thin sidewall structure 172 extends vertically up to above (e.g., 100-300 Å above) the top surfaces of the word line 154 and the erase gate 164 and, in some embodiments, below (e.g., 50-100 Å below) top surfaces of the metal gates 118. By extending above the top surfaces of the word line 154 and the erase and control gates 162, 164, the floating gate spacer 168, the dielectric lining 170, and the thin sidewall structure 172 form dielectric projections 139 separating the top surfaces of the word line 154 and the erase and control gates 162, 164. The dielectric lining 170 and the thin sidewall structure 172 are, for example, oxides, such as silicon dioxide, and the floating gate spacer 168 is, for example, an ONO dielectric.

A source/drain silicide contact pad 140a, 140b is formed over each source/drain region 114, and a memory silicide contact pad 141b is formed over each word line 154, control gate 162, and erase gate 164 of the memory cell devices 102. Source/drain conductive contacts 142b individual to the source/drain regions 114, and memory conductive contacts 143b individual to the word lines 154 and the erase and control gates 162, 164 of the memory cell devices 102, extend vertically down through the interlayer dielectric 108 to corresponding silicide contact pads 140, 141. The silicide contact pads 140, 141 are, for example, nickel silicide, cobalt silicide, or titanium silicide. The conductive contacts 142, 143 are, for example, formed of one or more of titanium, titanium nitride, and tungsten.

By way of recessing the top surfaces of the word lines 154 and the erase gates 164 of the memory cell devices 102 relative to the top surfaces of the metal gates 118, the memory silicide contact pads 141 formed over the top surfaces of the word lines 154 and the erase gates 164 are also recessed relative to the top surfaces of the metal gates 118. Further, by forming one or more of the floating gate spacers 168, the thin sidewall structures 172, the dielectric liners 170, the main sidewall structure 148, and the contact etch stop 150 to extend to above (e.g., 100-300 A above) the top surfaces of the word lines 154 and the erase gates 164, the memory silicide contact pads 141 formed over top surfaces of the word lines 154 and the erase gates 164 are also recessed relative to these structures. Advantageously, recessing the memory silicide contact pads 141 while leaving a dielectric projection 139 therebetween mitigates the possibility of forming a silicide bridge between the word lines 154, the erase gates 164 and the control gates 162, since the top surfaces are spaced farther apart. Further, recessing the memory silicide contact pads 141 allows compatibility with HKMG technology.

In operation, each memory cell device 102 stores a variable amount of charge, such as electrons, in the floating gate 152. The charge is advantageously stored in a non-volatile manner so that the stored charge persists in the absence of power. The amount of charge stored in the floating gate 152 represents a value, such as binary value, and is varied through program (i.e., write), read, and erase operations. These operations are performed through selective biasing of the control gate 162, the word line 154, and the erase gate 164.

During a program operation of a memory cell device 102, the control gate 162 is biased with a high (e.g., at least an order of magnitude higher) voltage relative a voltage applied across the channel region 116 and/or relative to a voltage applied to the word line 154. The high bias voltage promotes Fowler-Nordheim tunneling of carriers from the channel region 116 towards the control gate 162. As the carriers tunnel towards the control gate 162, the carriers become trapped in the floating gate 152.

During an erase operation of a memory cell device 102, the erase gate 164 is biased with a high (e.g., at least an order of magnitude higher) voltage relative a voltage applied across the channel region 116 and/or relative to a voltage applied to the control gate 162. The high bias voltage promotes Fowler-Nordheim tunneling of carriers from the floating gate 152 towards the erase gate 164. As the carriers tunnel towards the erase gate 164, the carriers become dislodged or otherwise removed from the floating gate 152.

Charge stored in the floating gate 152 of a memory cell device 102 screens an electric field formed between the control gate 162 and the channel region 116 when the control gate 162 is biased. This has an effect of increasing the threshold voltage $V_{th}$ of the memory cell device 102 by an amount $\Delta V_{th}$. During a read operation, a voltage is applied to the word line 154 to induce part of the channel region 116 to conduct. Application of a voltage to the word line 154 attracts carriers to part of the channel region 116 adjacent to the word line 154. Further, a voltage greater than $V_{th}$, but less than $V_{th}+\Delta V_{th}$, is applied to the control gate 162 If the memory cell device 102 turns on (i.e., allows charge to flow), then it stores a first data state (e.g., a logical "0"). If the memory cell device 102 does not turn on, then it stores a second data state (e.g., a logical "1").

In view of the foregoing, it should be appreciated that the dielectric projections 139 of FIGS. 1A & B mitigate the likelihood of forming a silicide bridge between neighboring gates. The dielectric projections 139 can be formed of one or more types of dielectric materials and one or more layers of dielectric material. Further, while the foregoing discussion focused on MONOS, SONOS, and ESF3 split gate flash memory cells, other types of memory cells can employ dielectric projections 139 with memory silicide contact pads 141 recessed relative to the dielectric projections 139 to mitigate the concern of silicide bridging between neighboring gates.

Figure 2:
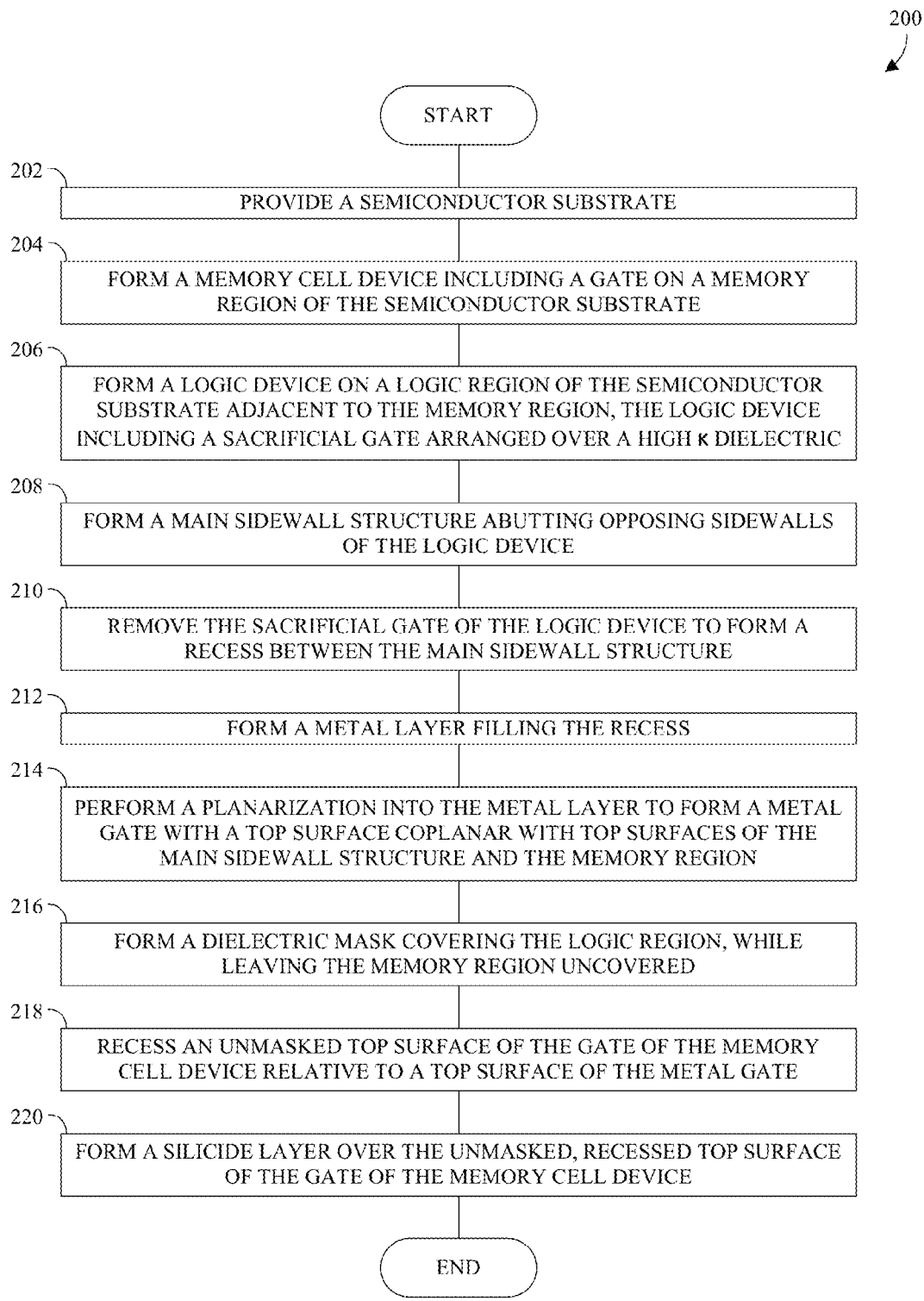
FIG. 2 illustrates a flow chart of some embodiments of a method of manufacturing a semiconductor structure with memory cell devices and high κ, metal gate logic devices, the memory cell devices including recessed gates upon which silicide is formed.

With reference to FIG. 2, a flow chart 200 of some embodiments of a method for manufacturing the semiconductor structure is provided. According to the method, a semiconductor substrate is provided (Action 202). A memory cell device including a gate is formed (Action 204) on a memory region of the semiconductor substrate. The memory cell device is, for example, a MONOS split gate flash memory cell device or an ESF3 flash memory cell device. For a MONOS split gate flash memory cell, the gate is, for example, the select gate or the memory gate. For an ESF3 flash memory cell, the gate is, for example, an erase gate or a word line. A logic device is formed (Action 206) on a logic region of the semiconductor substrate adjacent to the memory region. The logic device includes a sacrificial gate arranged over a high κ dielectric. The sacrificial gate is typically formed of polysilicon. A main sidewall structure abutting opposing sidewalls of the logic device is formed (Action 208), and the sacrificial gate of the logic device is removed (Action 210) to form a recess between the main sidewall structure. A metal layer filling the recess is formed (Action 212), and a planarization into the metal layer is performed (Action 214) to form a metal gate with a top surface coplanar with top surfaces of the main sidewall structure and the memory region. A dielectric mask covering the logic region is formed (Action 216), while leaving the memory region uncovered. An unmasked top surface of the gate of the memory cell device is recessed (Action 218) relative to a top surface of the metal gate, and a silicide layer is formed (Action 220) over the unmasked, recessed top surface of the gate of the memory cell device.

Advantageously, forming silicide contact pads on the polysilicon gates of the memory cell device subsequent to forming replacing the sacrificial gates with metal gates allows for compatibility with HKMG technology. Further, recessing the stop surfaces of these gates before forming the silicide contact pads reduces the likelihood of a silicide bridge between neighboring gates because the top surfaces of the neighboring gates are farther apart.

Figure 3A:
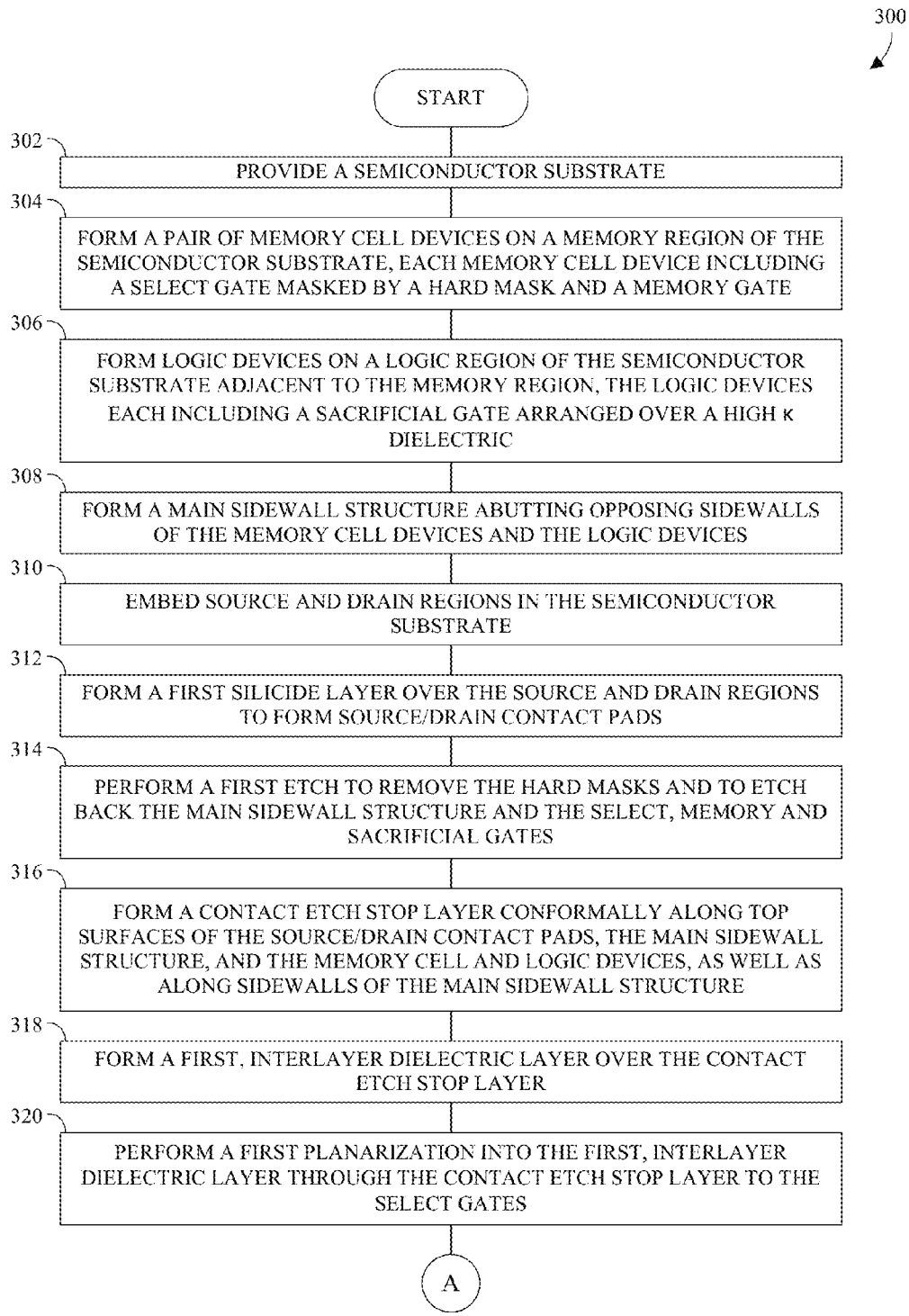
FIGS. 3A & B illustrate a flow chart of some embodiments of a method of manufacturing a semiconductor structure with memory cell devices and high κ, metal gate logic devices, the memory cell devices including recessed gates upon which silicide is formed.
Figure 3B:
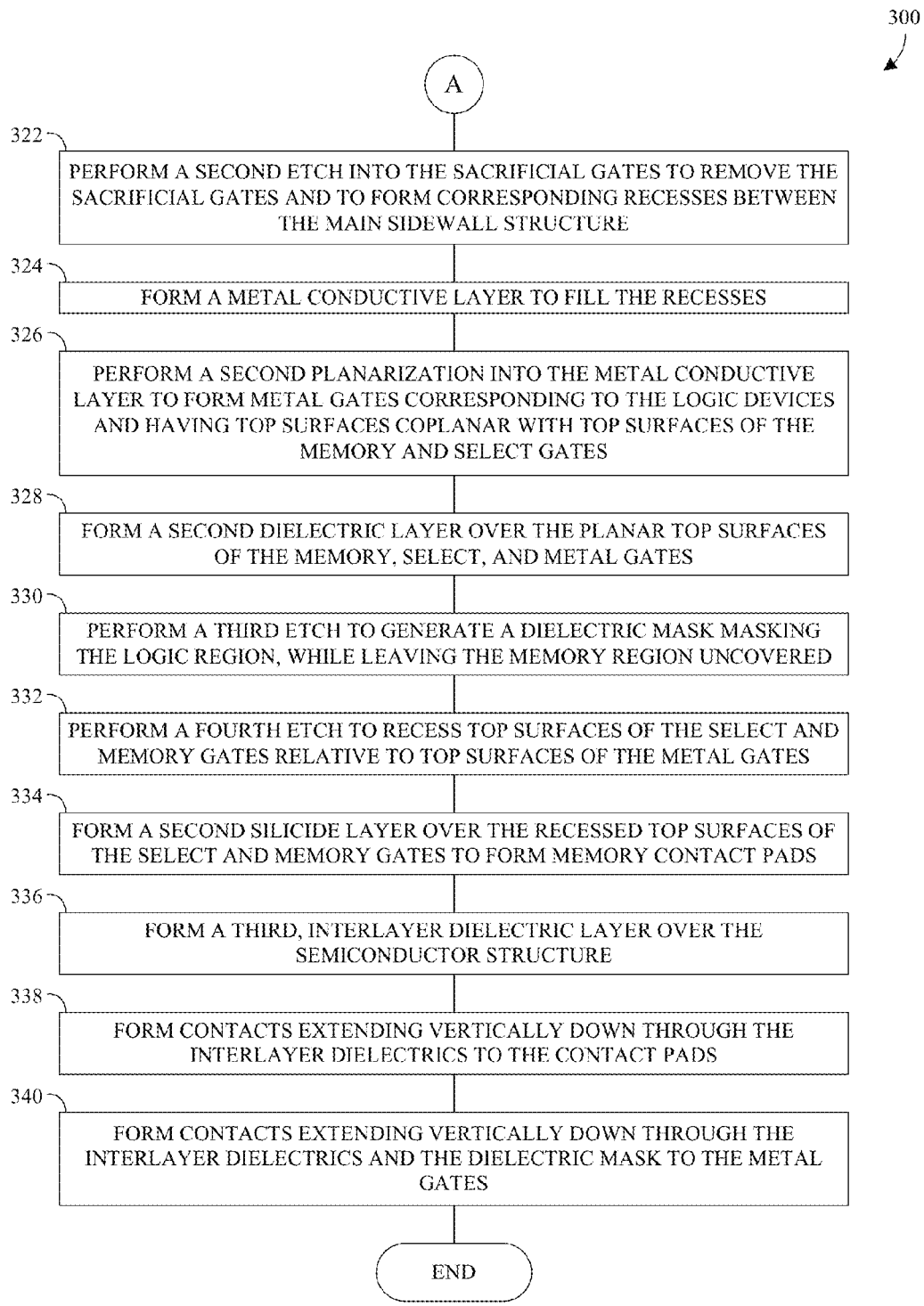

With reference to FIGS. 3A & B, a flow chart 300 of some embodiments of an expanded method for manufacturing the semiconductor structure is provided. The expanded is described in connection with a SONOS or MONOS split gate flash memory cell devices, but it is to be understood that it is equally applicable to other types of split gate flash memory cell devices, such as the ESF3 memory cell device.

According to the expanded method, a semiconductor substrate is provided (Action 302). A pair of memory cell devices are formed (Action 304) on a memory region of the semiconductor substrate. Each memory cell device includes a select gate masked by a hard mask and a memory gate. Logic devices are formed (Action 306) on a logic region of the semiconductor substrate adjacent to the memory region. The logic devices each include a sacrificial gate arranged over a high κ dielectric. A main sidewall structure is formed (Action 308) abutting opposing sidewalls of the memory cell devices and the logic devices. Source and drain regions are embedded (Action 310) in the semiconductor substrate. A first silicide layer is formed (Action 312) over the source and drain regions to form source/drain contact pads. A first etch is performed (Action 314) to remove the hard masks and to etch back a top portion of the main sidewall structure and stop on the select, memory and sacrificial gates. A contact etch stop layer is conformally formed (Action 316) along top surfaces of the source/drain contact pads, the main sidewall structure, and the memory cell and logic devices, as well as along sidewalls of the main sidewall structure. A first, interlayer dielectric layer is formed (Action 318) over the contact etch stop layer. A first planarization is performed (Action 320) into the first, interlayer dielectric layer through the contact etch stop layer to the select gates. A second etch is performed (Action 322) into the sacrificial gates to remove the sacrificial gates and to form corresponding recesses between the main sidewall structure. A metal conductive layer is formed (Action 324) to fill the recesses. A second planarization is performed (Action 326) into the metal conductive layer to form metal gates corresponding to the logic devices and having top surfaces coplanar with top surfaces of the memory and select gates. A second dielectric layer is formed (Action 328) over the planar top surfaces of the memory, select, and metal gates. A third etch is performed (Action 330) to generate a dielectric mask masking the logic region, while leaving the memory region uncovered. A fourth etch is performed (Action 332) to recess top surfaces of the select and memory gates relative to top surfaces of the metal gates. A second silicide layer is formed (Action 334) over the recessed top surfaces of the select and memory gates to form memory contact pads. A third, interlayer dielectric layer is formed (Action 336) over the semiconductor structure. Contacts extending vertically down through the interlayer dielectrics are formed (Action 338) to the contact pads. Contacts extending vertically down through the interlayer dielectrics and the dielectric mask are formed (Action 340) to the metal gates While the disclosed methods (e.g., the methods described by the flowcharts 200, 300) are illustrated and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

With reference to FIGS. 4-26, cross-sectional views of some embodiments of the semiconductor structure at various stages of manufacture are provided to illustrate the expanded method. Although FIGS. 4-26 are described in relation to the expanded method, it will be appreciated that the structures disclosed in FIGS. 4-26 are not limited to the expanded method, but instead may stand alone as structures independent of the expanded method. Similarly, although the expanded method is described in relation to FIGS. 4-26, it will be appreciated that the expanded method is not limited to the structures disclosed in FIGS. 4-26, but instead may stand alone independent of the structures disclosed in FIGS. 4-26.

Figure 4:
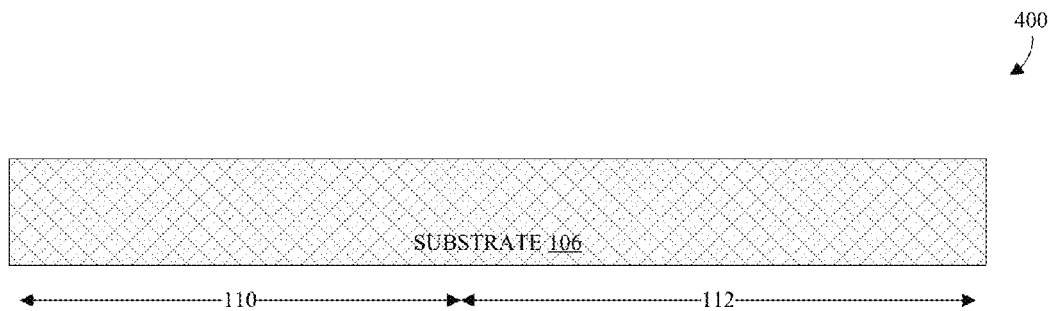
FIGS. 4-26 illustrate a series of cross-sectional views of some embodiments of a semiconductor structure with memory cell devices and high κ, metal gate logic devices, the memory cell devices including recessed gates upon which silicide is formed.

FIG. 4 illustrates a cross-sectional view 400 of some embodiments corresponding to Action 302. As shown by FIG. 4, a semiconductor substrate 106 is provided. The semiconductor structure includes a memory region 110 and a logic region 112 typically arranged around the memory region 110. The semiconductor substrate 106 is typically planar with a uniform thickness. Further, the semiconductor substrate 106 is, for example, a bulk substrate of silicon, germanium, or group III and group V elements. Alternatively, the semiconductor substrate 106 is, for example, a semiconductor-on-insulator (SOI) substrate.

FIGS. 5-12 illustrate cross-sectional views 500-1200 of some embodiments corresponding to Action 304.

Figure 5:
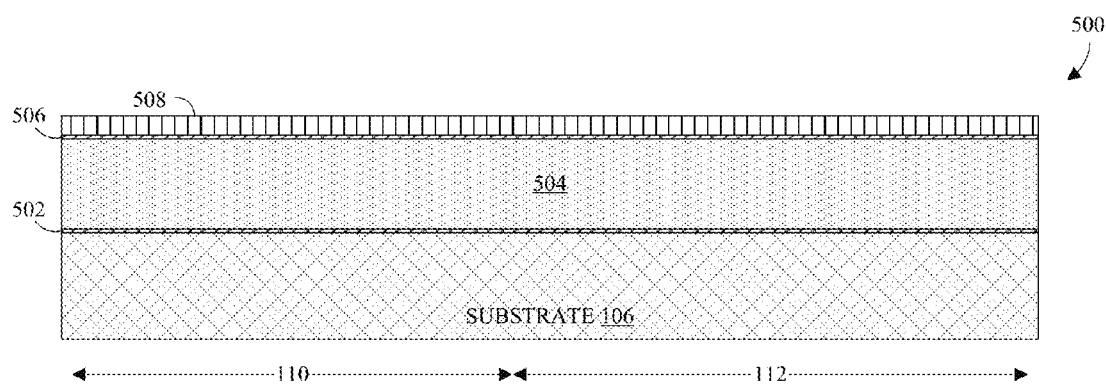

As shown by FIG. 5, a first dielectric layer 502, a first conductive layer 504, a second dielectric layer 506, and a hard mask layer 508 are stacked or formed in that order over a top surface of the semiconductor substrate 106. Each of the layers 502-508 typically has a uniform thickness. The first and second dielectric layers 502, 506 are, for example, an oxide, such as silicon dioxide. The first conductive layer 504 is formed from a silicon based material, such as polysilicon, for a SONOS split gate flash memory cell, and the first conductive layer 504 is formed from a metal or metal alloy for a MONOS split gate flash memory cell. The hard mask layer is 508, for example, a nitride or a multilayer nitride-oxide-nitride (NON) film.

Figure 6:
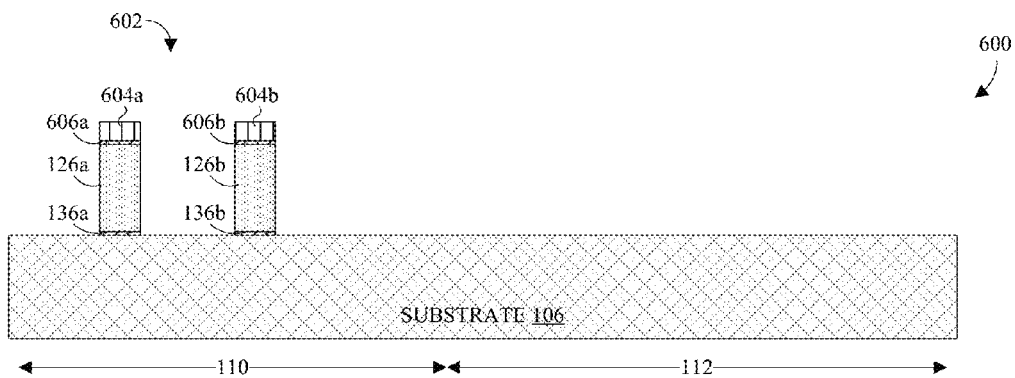

As shown by FIG. 6, a first etch is performed through the hard mask, second dielectric, first conductive, and first dielectric layers 502-508 to form a pair of spaced select gates 126a, 126b in the memory region 110 of the semiconductor substrate 106. The select gates 126 form a central region 602 between the select gates 126 and rest upon select gate dielectrics 136a, 136b electrically isolating the select gates 126 from the semiconductor substrate 106. Further, the select gates 126 are masked by memory hard masks 604a, 604b electrically isolated from the select gate 126 by memory hard mask dielectrics 606a, 606b.

Figure 7:
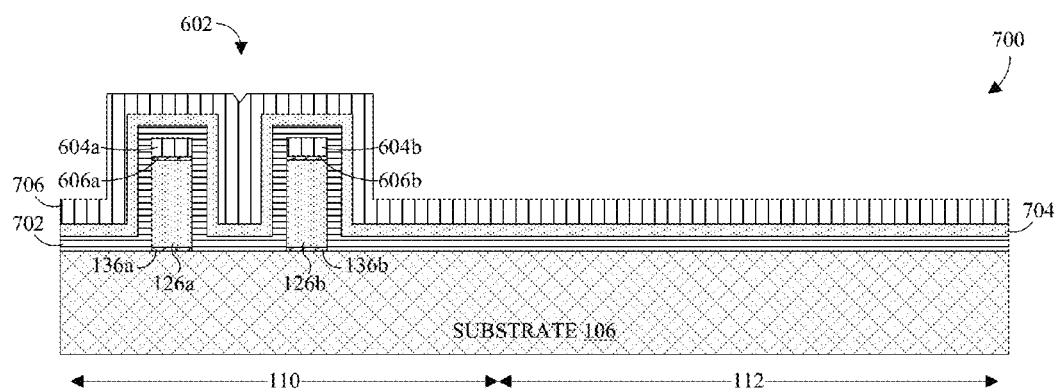

As shown by FIG. 7, a charge trapping dielectric layer 702, a second conductive layer 704, and a third dielectric layer 706 are conformally formed, in that order, over the semiconductor structure. The charge trapping dielectric layer 702 is conformally formed over top surfaces of the semiconductor substrate 106 and the memory hard masks 604, and along sidewalls of the select gate dielectrics 136, the select gates 126, the memory hard mask dielectrics 606, and the memory hard masks 604. The second conductive layer 704 is conformally formed over the charge trapping dielectric layer 702, and the third dielectric layer 706 is conformally formed over the second conductive layer 704. In some embodiments, the second conductive layer 704 has a thickness of about 100 A and the charge trapping dielectric has a thickness of about 100-200 A. The charge trapping dielectric layer 702 is, for example, a multilayer charge trapping dielectric, such as an ONO dielectric or an OSiO dielectric. The second conductive layer 704 is, for example, polysilicon, and the third dielectric layer 706 is, for example, silicon nitride.

Figure 8:
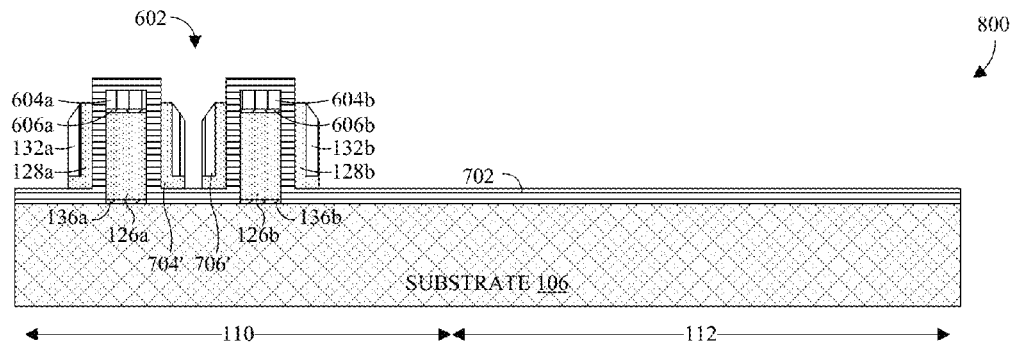

As shown by FIG. 8, a second etch is performed through the second conductive layer 704 and the third dielectric layer 706 to form a pair of memory gates 128a, 128b over and laterally abutting the charge trapping dielectric 702, as well as a pair of memory gate spacers 132a, 132b over and laterally abutting corresponding memory gates 128.

Figure 9:
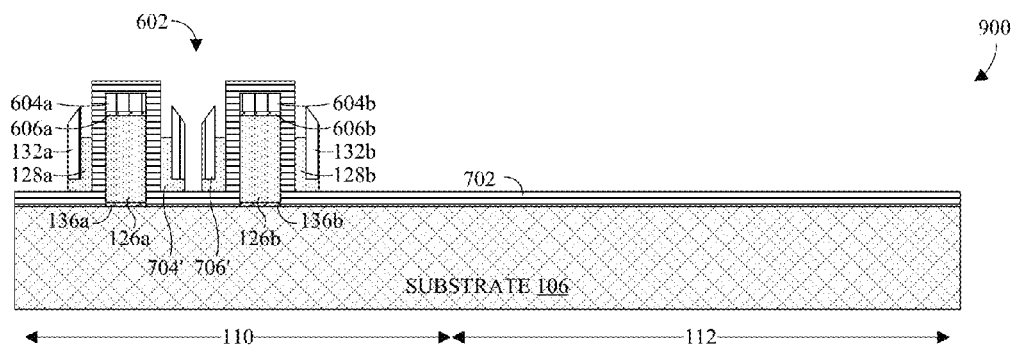

As shown by FIG. 9, a third etch is performed partially into the remaining second conductive layer 704' to recess top surfaces of the memory gates 128 relative to top surfaces of the memory gate spacers 132.

Figure 10:
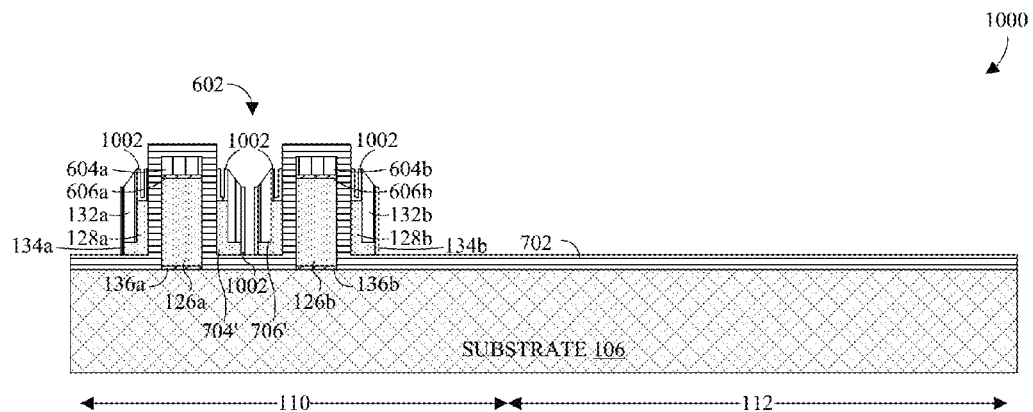

As shown by FIG. 10, a pair of thin spacers 134a, 134b corresponding to the memory gates 128 are formed as part of a fourth dielectric layer 1002 to cover exposed sidewalls of the memory gates 128. For example, an intermediate dielectric layer can be conformally deposited and selectively etched to form the fourth dielectric layer 1002. Also, of note, portions of the fourth dielectric layer 1002 mask the top surfaces of the memory gates 128. The fourth dielectric layer 1002 is, for example, silicon nitride.

Figure 11:
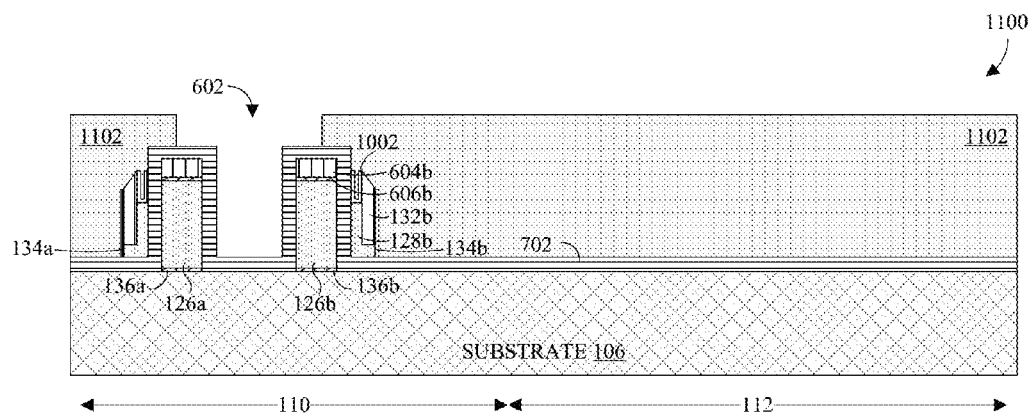

As shown by FIG. 11, a mask 1102 is formed and a fourth etch is performed through portions of the remaining second conductive layer 704', the remaining third dielectric layer 706', and the fourth dielectric layer 1002 in the central region 602 to remove these portions from the central region 602. Typically, the fourth etch is an isotropic dry etch.

Figure 12:
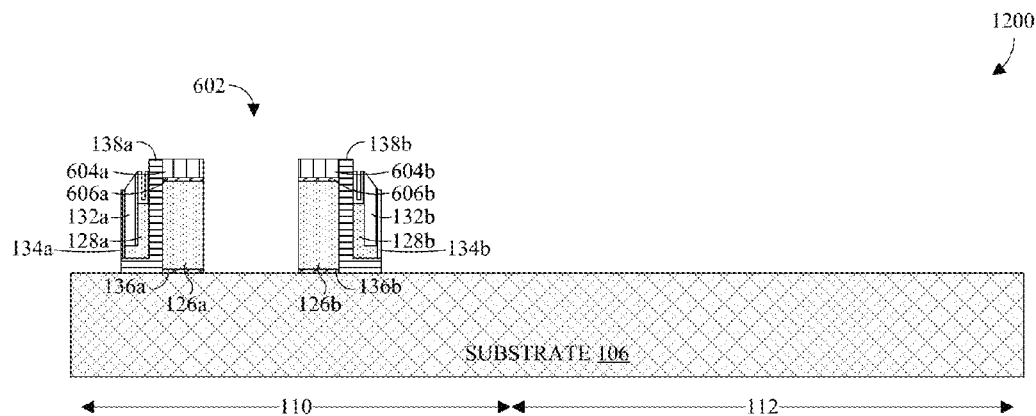

As shown by FIG. 12, a fifth etch is performed through the charge trapping dielectric layer 702 to remove uncovered, horizontal portions of the charge trapping dielectric layer 702. This results in charge trapping dielectrics 138a, 138b individual to the memory gates 128. In some embodiments, the uncovered portions of the charge trapping dielectric layer 702 include portions covering the memory hard masks 604. The fifth etch can, for example, be a fully dry etch, a fully wet etch, or a combination wet and dry etch.

Figure 13:
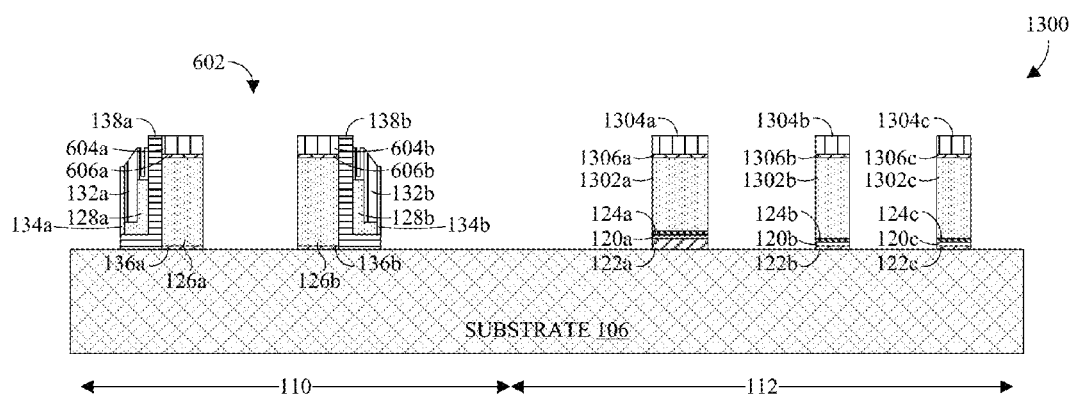

FIG. 13 illustrates a cross-sectional view 1300 of some embodiments corresponding to Action 306. As shown by FIG. 13, a trio of sacrificial gates 1302a-c is formed over corresponding high κ dielectrics 120a-c in the logic region 112 of the semiconductor substrate 106. The sacrificial gates 1302 are masked by logic hard masks 1304a-c electrically isolated from the sacrificial gates 1302 by logic hard mask dielectrics 1306a-c. Further, metal gate dielectrics 122a-c corresponding to the sacrificial gates 1302 are formed between the semiconductor substrate 106 and the high κ dielectrics 120, and etch stops 124a-c corresponding to the sacrificial gates 1302 are formed between the sacrificial gate 1302 and the high κ dielectrics 120. For high voltage applications, the metal gate dielectric 122 is typically thicker than it would otherwise be. The sacrificial gates 1302 are, for example, polysilicon, the metal gate and logic hard mask dielectrics 122, 1306 are, for example, an oxide, such as silicon dioxide, the etch stops 124 are, for example, silicon nitride, the high κ dielectrics 120 are, for example, HfO$_2$, AlO$_3$, or Ta$_2$O$_5$, and the logic hard masks 1504 are, for example, an oxide, a silicon nitride or a multilayer nitride-oxide-nitride (NON) film. In some embodiments, the logic hard masks 1504 have a thickness of 50-1100 A.

Figure 14:
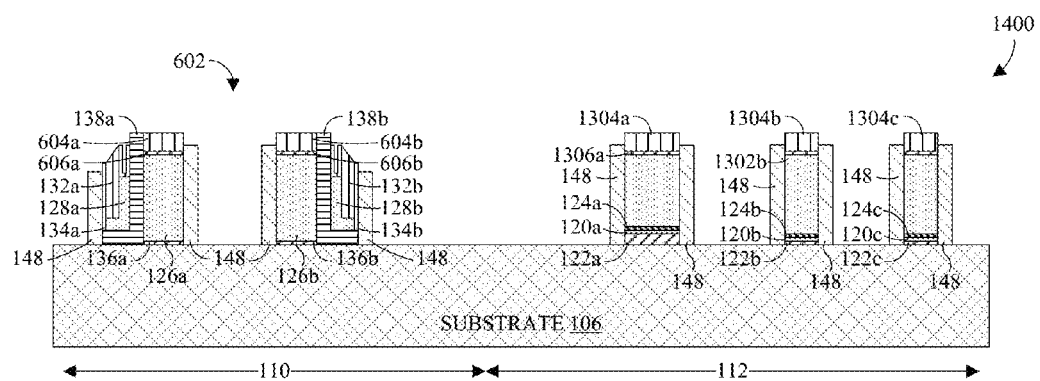

FIG. 14 illustrates a cross-sectional view 1400 of some embodiments corresponding to Action 308. As shown by FIG. 14, a main sidewall structure 148 is formed along sidewalls of the select gates 126 in the central region 602, and along sidewalls of the charge trapping dielectrics 138 and the thin spacers 134 outside the central region 602. Further, the main sidewall structure 148 is formed along opposing sidewalls of the sacrificial gates 1302. The main sidewall structure 148 can be formed by, for example, conformally forming an intermediate dielectric layer and selectively etching the intermediate dielectric layer to form the main sidewall structure 148. The main sidewall structure 148 is, for example, a dielectric, such as silicon nitride.

Figure 15:
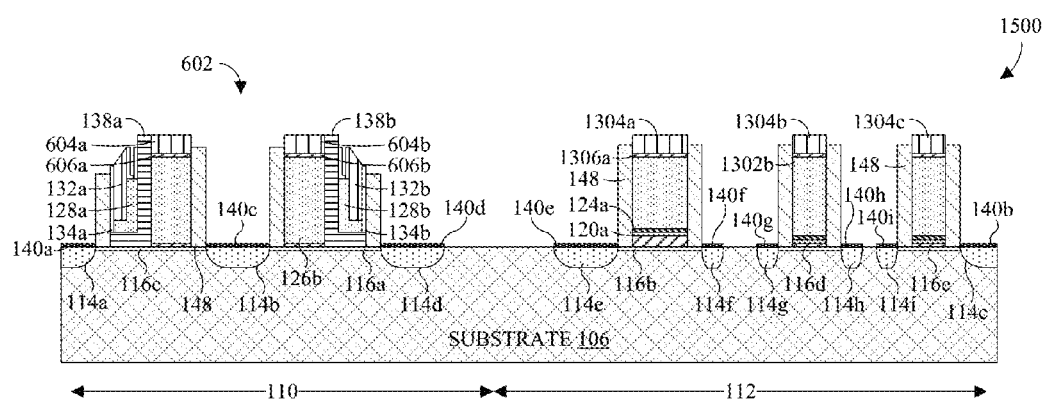

FIG. 15 illustrates a cross-sectional view 1500 of some embodiments corresponding to Actions 310 and 312. As shown by FIG. 15, source and drain regions 114a-i are embedded within the semiconductor substrate 106 to form channel regions 116a-e, and a first silicide layer is formed over the source and drain regions 114 to form contact pads 140a-i. In some embodiments, the first silicide layer has a thickness of about 50-200 A. The first silicide layer is, for example, nickel silicide, cobalt silicide, or titanium silicide.

Figure 16:
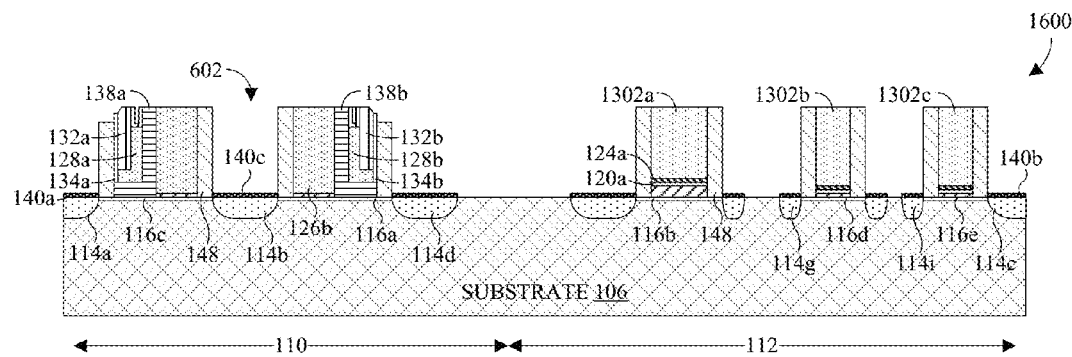

FIG. 16 illustrates a cross-sectional view 1600 of some embodiments corresponding to Action 314. As shown by FIG. 16, a sixth etch is performed to remove the memory and logic hard masks 604, 1304 and the memory and logic hard mask dielectrics 606, 1306. The sixth etch further stops on the sacrificial gates 1302, the select gates 126, and the memory gates 128, while minimally etching back a top, minor portion of the main sidewall structure 148, the memory gate spacers 132, the charge trapping dielectrics 138, and the thin spacers 134.

Figure 17:
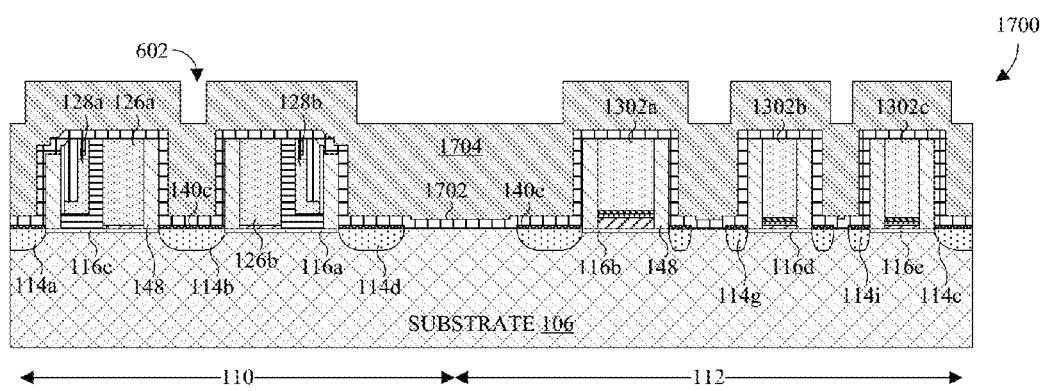

FIG. 17 illustrates a cross-sectional view 1700 of some embodiments corresponding to Action 316 and 318. As shown by FIG. 17, a contact etch stop layer 1702 is conformably formed over the semiconductor structure. The contact etch stop layer 1702 runs along top surfaces of the contact pads 140 and the memory, select, and sacrificial gates 126, 128, 1302, as well as along sidewalls of the main sidewall structures 148. Also shown, a fifth, interlayer dielectric layer 1704 is formed over the contact etch stop layer 1702.

Figure 18:
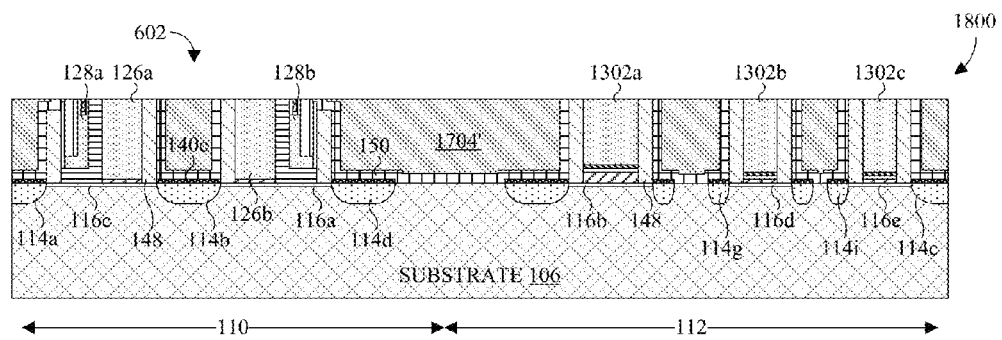

FIG. 18 illustrates a cross-sectional view 1800 of some embodiments corresponding to Action 320. As shown by FIG. 18, a first planarization is performed into the fifth, interlayer dielectric layer 1704, through the contact etch stop layer 1702, and stops on the select gates 126. This forms a contact etch stop 150. In some embodiments, the first planarization is also into the select gates 126, the memory gates 128, and the sacrificial gates 1302 to co-planarize top surfaces of these gates 126, 128, 1302 and/or otherwise reduce the height of these gates 126, 128, 1302. The first planarization can, for example, be performed using a chemical machine polish (CMP).

Figure 19:
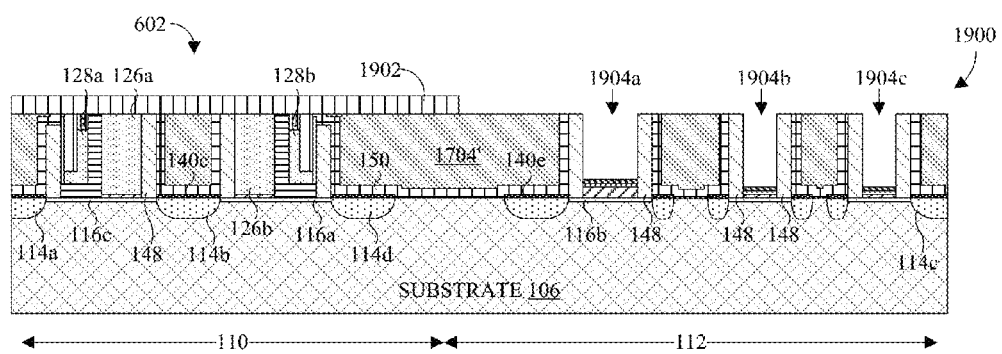

FIG. 19 illustrates a cross-sectional view 1900 of some embodiments corresponding to Action 322. As shown by FIG. 19, a second memory hard mask 1902 is formed over the memory region 108 and a seventh etch is performed into the sacrificial gates 1302 to remove the sacrificial gates 1302 and to form corresponding recesses 1904a-c between the main sidewall structure 148. The second memory hard mask 1902 is, for example, 30-150 A thick and/or is, for example, formed of oxide, titanium nitride, silicon nitride, or an NON film.

Figure 20:
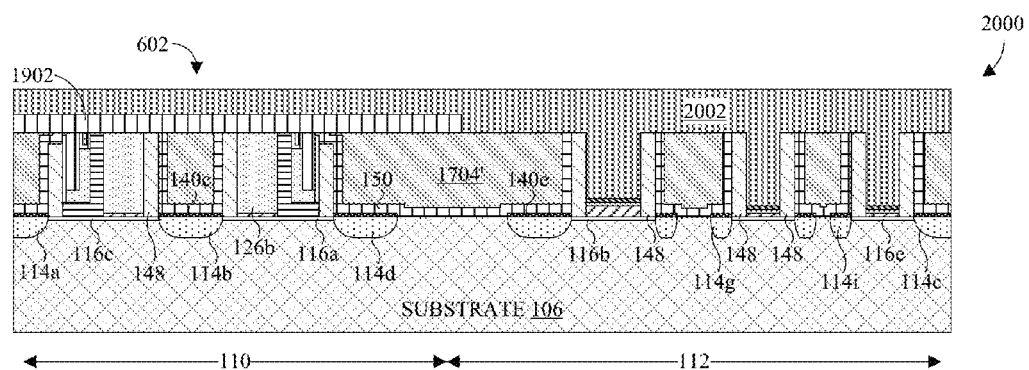

FIG. 20 illustrates a cross-sectional view 2000 of some embodiments corresponding to Action 324. As shown by FIG. 20, a third, metal conductive layer 2002 is formed to fill the recesses 1904.

Figure 21:
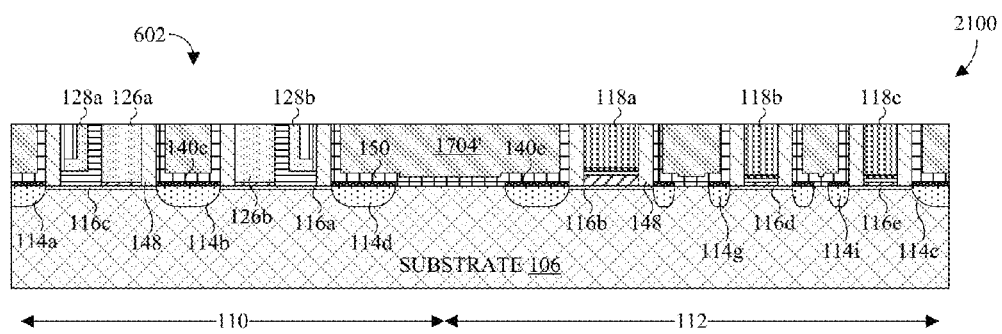

FIG. 21 illustrates a cross-sectional view 2100 of some embodiments corresponding to Action 326. As shown by FIG. 21, a second planarization is performed through the second memory hard mask 1902 and into the metal conductive layer 2002 to top surfaces of the main sidewall structure 148 to form metal gates 118a-c corresponding to the recesses 1904 and having top surfaces coplanar with top surfaces of the memory and select gates 126, 128. In some embodiments, the second planarization is also into the select and memory gates 126, 128, and/or otherwise reduces the height of these gates 126, 128. Further, in some embodiments, the top surfaces of the metal gates 118 are 350-700 A above the top surface of the semiconductor substrate 106. The second planarization can, for example, be performed using a CMP.

Figure 22:
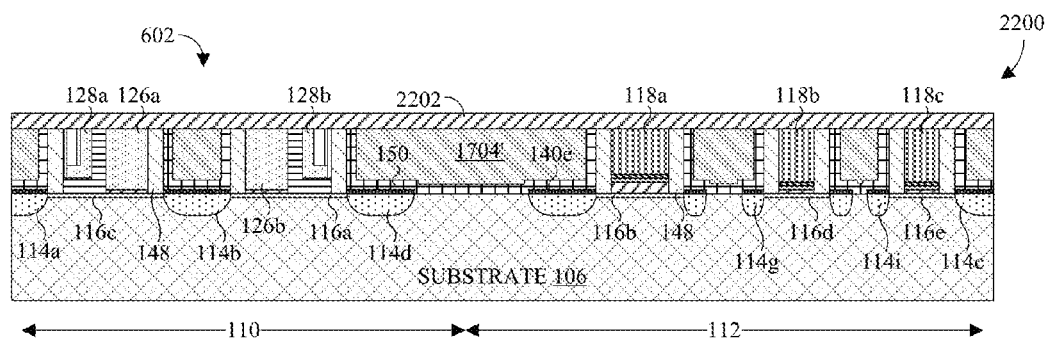

FIG. 22 illustrates a cross-sectional view 2200 of some embodiments corresponding to Action 328. As shown by FIG. 22, a sixth dielectric layer 2202 is formed over the planar top surfaces of the memory, select and metal gates 118, 126, 128. The sixth dielectric layer 2202 typically includes a uniform thickness. In some embodiments, the sixth dielectric layer includes a thickness of about 50-300 A. Further, the sixth dielectric layer 2202 is, for example, and oxide, such as silicon dioxide.

Figure 23:
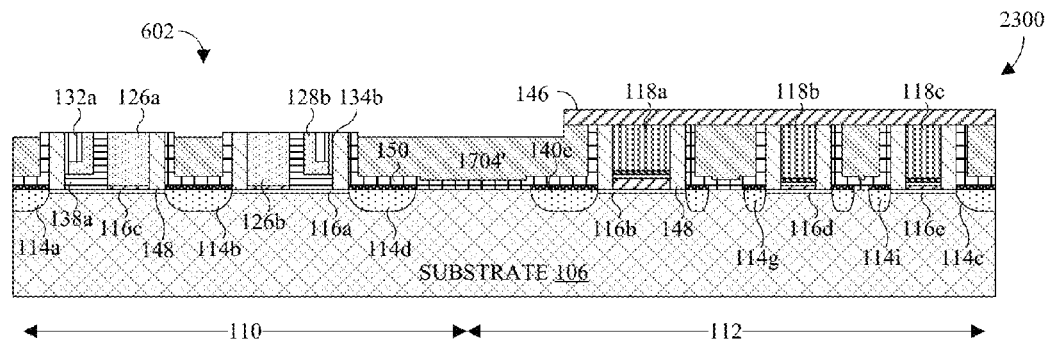

FIG. 23 illustrates a cross-sectional view 2300 of some embodiments corresponding to Action 330. As shown by FIG. 23, a seventh etch is performed through part of the sixth dielectric layer 2202 to form a dielectric mask 146 over the logic region 112, while leaving the memory region 110 exposed. In other words, the metal gates 118 are masked, while leaving the select and memory gates 126, 128 exposed. In some embodiments, the seventh etch further has the effect of recessing top surfaces of the memory region 110 relative to top surfaces of the logic region 112. For example, portions of the main sidewall structure 148 in the memory region 110 are recessed. As another example, top surfaces of the charge trapping dielectrics 138 and the memory gate and thin spacers 132, 134 are recessed. The extent of the recessing is typically about 50-100 A.

Figure 24:
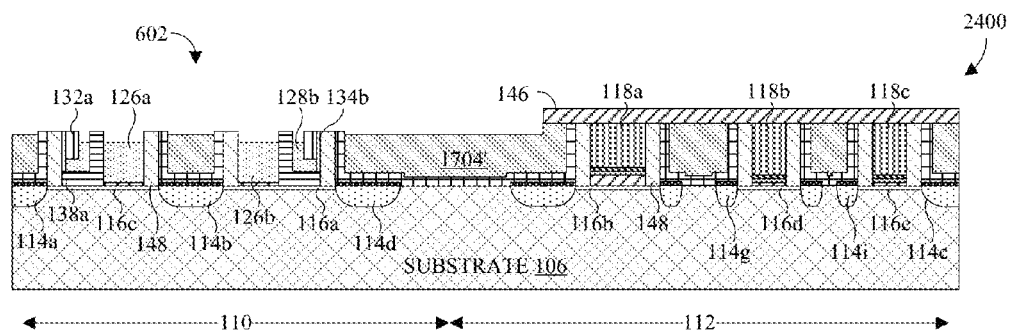

FIG. 24 illustrates a cross-sectional view 2400 of some embodiments corresponding to Action 332. As shown by FIG. 24, an eighth etch is performed into the select and memory gates 126, 128 to recess top surfaces relative to top surfaces of the metal gates 118 and relative to top surfaces of the neighboring dielectrics, such as the charge trapping dielectrics 138. In some embodiments, the recess depth is 10-500 A or 150-400 A below top surfaces of the metal gates 118 and/or top surfaces of neighboring dielectrics. The eighth etch is performed by, for example, a dry etch, a wet etch, or a combination of the two. Where the select and memory gates 126, 128 are formed of polysilicon, the dry etch chemistry can include, for example, chlorine gas (Cl$_2$), boron trichloride (BCl$_3$), argon (Ar), or a fluorine gas. Further, where the select and memory gates 126, 128 are formed of polysilicon, the wet etch chemistry can include, for example, an alkali solution. In some embodiments, the eighth etch further recesses silicon dot or nitride layers of the charge trapping dielectrics 138.

Figure 25:
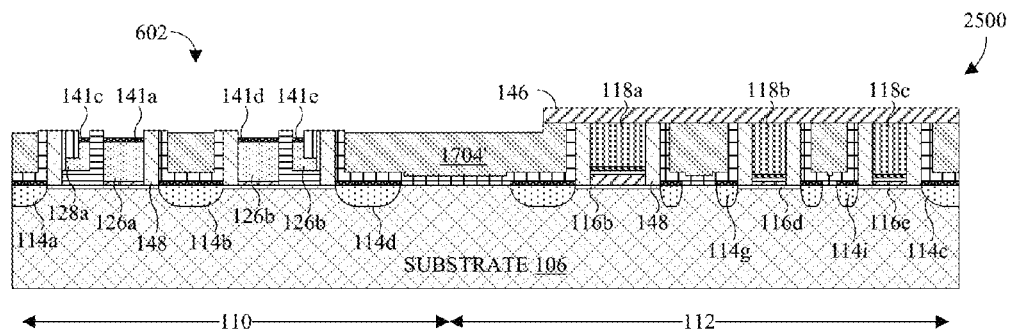

FIG. 25 illustrates a cross-sectional view 2500 of some embodiments corresponding to Actions 334. As shown by FIG. 25, a second silicide layer is formed over the recessed top surfaces of the select and memory gates 126, 128 to form memory contact pads 141a, 141c-e. In some embodiments, the second silicide layer has a thickness of about 50-200 A. Further, in some embodiments, the top surface of the second silicide layer (i.e., the top surfaces of the memory contact pads 141) is recessed about 50-100 A below neighboring dielectrics. The second silicide layer is, for example, nickel silicide, cobalt silicide, or titanium silicide.

FIG. 25 illustrates a cross-sectional view 2500 of some embodiments corresponding to Actions 334. As shown by FIG. 25, a second silicide layer is formed over the recessed top surfaces of the select and memory gates 126, 128 to form memory contact pads 141a, 141c-e. The second silicide layer is, for example, nickel silicide. Advantageously, the risk of forming a silicide bridge between the select and memory gates 126, 128 is greatly reduced by the recessed top surfaces of the select and memory gates 126, 128 because the distance between the top surfaces is increased. Further, because the second silicide layer is formed after the second planarization, the second silicide layer persists and compatibility with HKMG technology is maintained.

Figure 26:
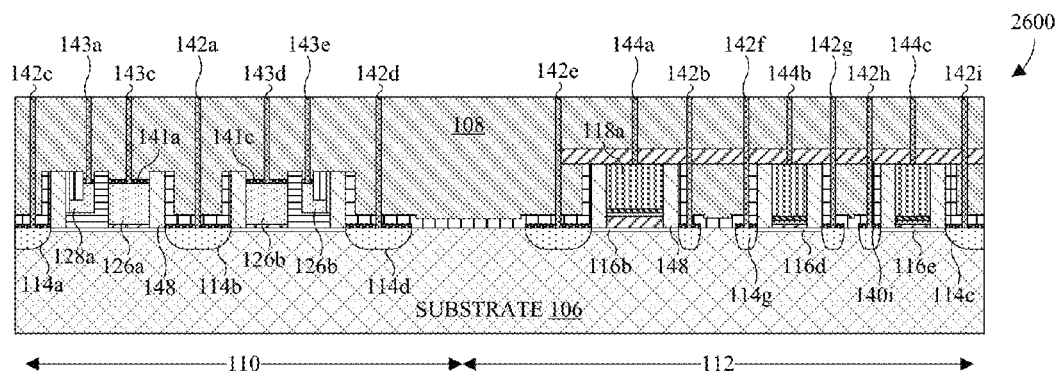

FIG. 26 illustrates a cross-sectional view 2600 of some embodiments corresponding to Actions 336-340. As shown by FIG. 26, an seventh, interlayer dielectric is formed over the top surface of the semiconductor structure to form an interlayer dielectric 108 (collectively formed from the remaining fifth dielectric layer 1704' and the seventh dielectric layer). Also formed are source/drain contacts 142a-i extending vertically down through the interlayer dielectric 108 to the source/drain contact pads 140, memory contacts 143a, 143c-e extending vertically down through the interlayer dielectric 108 to the memory contact pads 141, and logic contacts 144a-c extending vertically down through the interlayer dielectric 108 and the dielectric mask 146 to the metal gates 118.

Thus, as can be appreciated from above, the present disclosure provides an integrated circuit for an embedded flash memory device. A semiconductor substrate includes a memory region and a logic region adjacent to the memory region. A logic device is arranged over the logic region and includes a metal gate separated from the semiconductor substrate by a material having a dielectric constant exceeding 3.9. A flash memory cell device is arranged over the memory region. The flash memory cell device includes a memory cell gate electrically insulated on opposing sides by corresponding dielectric regions. A silicide contact pad is arranged over a top surface of the memory cell gate. The top surface of the memory cell gate and a top surface of the silicide contact pad are recessed relative to a top surface of the metal gate and top surfaces of the dielectric regions.

In other embodiments, the present disclosure provides a method for manufacturing an embedded flash memory device. A memory cell device is formed over a memory region of a semiconductor substrate. The memory cell device includes a memory cell gate electrically insulated on opposing sides by a pair of dielectric regions. A logic device is formed over a logic region of the semiconductor substrate. The logic device has a sacrificial gate separated from the semiconductor substrate by a material with a dielectric constant exceeding 3.9. The sacrificial gate is replaced with a metal gate. A dielectric mask at least partially covering the logic region is formed, while leaving the memory region uncovered. A top surface of the memory cell gate is recessed relative to a top surface of the metal gate and relative to top surfaces of the dielectric regions. A silicide contact pad is formed over the top surface of the memory cell gate.

In yet other embodiments, the present disclosure provides an integrated circuit for an embedded flash memory device. A semiconductor substrate includes a memory region and a logic region adjacent to the memory region. The memory region includes a common source/drain region and a pair of individual source/drain regions arranged on opposite sides of the common source/drain region. A logic device is arranged over the logic region and including a metal gate separated from the semiconductor substrate by a material having a dielectric constant exceeding 3.9. A pair of flash memory cell devices is arranged over the memory region. Each flash memory cell device corresponds to one of the individual source/drain regions and includes a select gate and a memory gate arranged between the common source/drain region and the corresponding individual source/drain region. Each flash memory cell device further includes a charge trapping dielectric arranged between neighboring sidewalls of the memory and select gates, and arranged under the memory gate. Silicide contact pads are respectively arranged over top surfaces of the select and memory gates. Top surfaces of the silicide contact pads are recessed relative to a top surface of the metal gate and top surfaces of the charge trapping dielectrics.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit for an embedded flash memory device, said integrated circuit comprising:
   a semiconductor substrate including a memory region and a logic region adjacent to the memory region;
   a logic device arranged over the logic region and including a metal gate separated from the semiconductor substrate by a material having a dielectric constant exceeding 3.9,
   a flash memory cell device arranged over the memory region, the flash memory cell device including a memory cell gate electrically insulated on opposing sides by corresponding dielectric regions; and a silicide contact pad arranged over a top surface of the memory cell gate, wherein the top surface of the memory cell gate and a top surface of the silicide contact pad are recessed relative to a top surface of the metal gate and top surfaces of the dielectric regions.

2. The integrated circuit according to claim 1, wherein the memory cell gate is one of a memory gate, a select gate, an erase gate, a word line, and a control gate.

3. The integrated circuit according to claim 1, wherein the flash memory cell device includes:
   a select gate;
   a memory gate spaced from the memory gate; and
   a charge trapping dielectric arranged under the memory gate and between neighboring sidewalls of the select and memory gates;
   wherein the memory cell gate is the select gate or the memory gate, and one of the dielectric regions includes the charge trapping dielectric.

4. The integrated circuit according to claim 1, wherein the flash memory cell device includes:
   a floating gate;
   an erase gate and a word line spaced from the floating gate on opposite sides of the floating gate;
   a control gate arranged over the floating gate; and
   a floating gate spacer arranged between neighboring sidewalls of the control gate, the word line, and the erase gate;
   wherein the memory cell gate is the control gate or the erase gate, and one of the dielectric regions includes the floating gate spacer.

5. The integrated circuit according to claim 1, wherein at least one of:
   the top surface of the memory cell gate is recessed about 10-500 Angstroms (A) below the top surface of the metal gate; and
   the top surface of the memory cell gate is recessed about 100-300 A below the top surfaces of the dielectric regions.

6. The integrated circuit according to claim 1, wherein the top surface of the silicide contact pad is recessed about 50-100 Angstroms below the top surfaces of the dielectric regions.

7. The integrated circuit according to claim 1, wherein the top surface of the memory cell gate is substantially planar or the top surface of the silicide contact pad is substantially planar.

8. The integrated circuit according to claim 1, wherein the top surfaces of the dielectric regions are recessed below the top surface of the metal gate.

9. The integrated circuit according to claim 1, further including:
   a dielectric mask at least partially covering the logic region, while leaving the memory region uncovered.

10. An integrated circuit for an embedded flash memory device, said integrated circuit comprising:
    a semiconductor substrate including a memory region and a logic region adjacent to the memory region, the memory region including a common source/drain region and a pair of individual source/drain regions arranged on opposite sides of the common source/drain region;
    a logic device arranged over the logic region and including a metal gate separated from the semiconductor substrate by a material having a dielectric constant exceeding 3.9;
    a pair of flash memory cell devices arranged over the memory region, wherein each flash memory cell device corresponds to one of the individual source/drain regions and includes:
      a select gate and a memory gate arranged between the common source/drain region and the corresponding individual source/drain region; and
      a charge trapping dielectric arranged between neighboring sidewalls of the memory and select gates, and arranged under the memory gate; and
    silicide contact pads respectively arranged over top surfaces of the select and memory gates, wherein top surfaces of the silicide contact pads are recessed relative to a top surface of the metal gate and top surfaces of the charge trapping dielectrics.

11. The integrated circuit according to claim 10, wherein at least one of:
    the top surfaces of the select and memory gates are recessed about 10-500 Angstroms (A) below the top surface of the metal gate; and
    the top surfaces of the select and memory gates are recessed about 100-300 A below the top surfaces of the charge trapping dielectrics.

12. The integrated circuit according to claim 10, wherein the top surfaces of the select and memory gates are substantially planar, and the top surfaces of the silicide contact pads are substantially planar.

13. The integrated circuit according to claim 10, wherein the top surfaces of the charge trapping dielectrics are recessed below the top surface of the metal gate.

14. The integrated circuit according to claim 10, further including:
    a dielectric mask at least partially covering the logic region, while leaving the memory region uncovered.

15. An integrated circuit for an embedded flash memory device, said integrated circuit comprising:
    a flash memory cell device arranged over a semiconductor substrate, the flash memory cell device including a memory cell gate electrically insulated on opposing sides by corresponding dielectric layers;
    a silicide contact pad arranged over a top surface of the memory cell gate, wherein the top surface of the memory cell gate and a top surface of the silicide contact pad are recessed relative to top surfaces of the dielectric layers; and
    a logic device arranged over the semiconductor substrate and comprising a metal gate with a top surface elevated above the top surface of the silicide contact pad.

16. The integrated circuit according to claim 15, wherein the metal gate is separated from the semiconductor substrate by a material having a dielectric constant exceeding about 3.9.

17. The integrated circuit according to claim 15, wherein the top surfaces of the dielectric layers are recessed below the top surface of the metal gate.

18. The integrated circuit according to claim 15, further comprising:
    a dielectric mask covering the logic device, while leaving the flash memory cell device uncovered; and
    an interlayer dielectric (ILD) layer covering the dielectric mask and the flash memory cell device.

19. The integrated circuit according to claim 15, wherein the flash memory cell device includes:
    an erase gate arranged over a first source/drain region of the semiconductor substrate;
    a wordline arranged between the first source/drain region and a second source/drain region of the semiconductor substrate;
    a floating gate arranged between the wordline and the erase gate;
    a control gate arranged over the floating gate; and dielectric layers arranged on opposing sides of the erase gate, the wordline, the floating gate, and the control gate; and wherein the memory cell gate is one of the wordline, the erase gate, and the control gate.

20. The integrated circuit according to claim 15, wherein the flash memory cell device includes:
- a select gate arranged between first and second source/drain regions of the semiconductor substrate;
- a memory gate arranged between the select gate and the second source/drain region; and
- dielectric layers arranged on opposing sides of the select and memory gates, wherein the dielectric layers are configured to isolate the select and memory gates from one another; and
- wherein the memory cell gate is one of the select and memory gates.

* * * * *